(12) United States Patent  
Sakai et al.

(10) Patent No.: US 7,163,846 B2
(45) Date of Patent: Jan. 16, 2007

(54) METHOD FOR MANUFACTURING CIRCUIT DEVICES

(75) Inventors: Noriyasu Sakai, Gunma (JP); Yusuke Igarashi, Gunma (JP); Masato Noguchi, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/667,681

(22) Filed: Sep. 22, 2003

(65) Prior Publication Data

US 2004/0101995 A1 May 27, 2004

(30) Foreign Application Priority Data

Sep. 27, 2002 (JP) .............. 2002-284034

(51) Int. Cl.
*H01L 21/48* (2006.01)
(52) U.S. Cl. .................. 438/127; 257/E21.502
(58) Field of Classification Search ................ 438/112, 438/124, 126, 127
See application file for complete search history.

(56) References Cited

U.S. PATENT DOCUMENTS

| 5,924,190 | A * | 7/1999 | Lee et al. ............... 29/827 |
| 6,358,776 | B1 * | 3/2002 | Takehara et al. ........... 438/113 |
| 6,767,767 | B1 * | 7/2004 | Hayashida et al. ......... 438/124 |
| 2004/0092129 | A1 | 5/2004 | Igarashi et al. |
| 2004/0097081 | A1 | 5/2004 | Igarashi et al. |
| 2004/0097086 | A1 | 5/2004 | Igarashi et al. |
| 2004/0106235 | A1 | 6/2004 | Igarashi et al. |
| 2004/0106288 | A1 | 6/2004 | Igarashi et al. |

FOREIGN PATENT DOCUMENTS

| JP | 11-077756 | 3/1999 |
| JP | 11-099539 | 4/1999 |
| JP | 11-195733 | 7/1999 |

* cited by examiner

*Primary Examiner*—Scott B. Geyer
(74) *Attorney, Agent, or Firm*—Fish & Richardson P.C.

(57) ABSTRACT

In order to prevent, in a resin sealing step, a conductive foil 10 from locally rising because of concentration of air intervening between the conductive foil 10 and lower mold 28A due to the charged pressure, a method for manufacturing circuit devices is provided. The method for manufacturing circuit devices includes the step of forming conductive patterns 21, which form a plurality of mounting portions 15 of a circuit element 22 on a conductive foil 10, in each block 12, the step of disposing the circuit element 22 on each mounting portion 15 of the conductive pattern 21 in each block 12, the step of performing resin sealing by bringing the lower mold 28A having an air vent 30 into contact with the backface of the conductive foil 10 in each block 12 and by performing transfer molding with an insulating resin 20 while disposing each mounting portion 15 of the block 12 in the same cavity, and the step of separating each mounting portion 15 by dicing.

10 Claims, 12 Drawing Sheets

PRIOR ART

FIG.13B

PRIOR ART

FIG.13C

PRIOR ART

METHOD FOR MANUFACTURING CIRCUIT DEVICES

BACKGROUND OF THE INVENTION

1. Field of the Invention

This invention relates to a method for manufacturing circuit devices, and more particularly to a method for manufacturing circuit devices including a resin sealing step that can prevent a planar body from being deformed inside a mold cavity.

2. Description of the Related Art

Figure 13A:
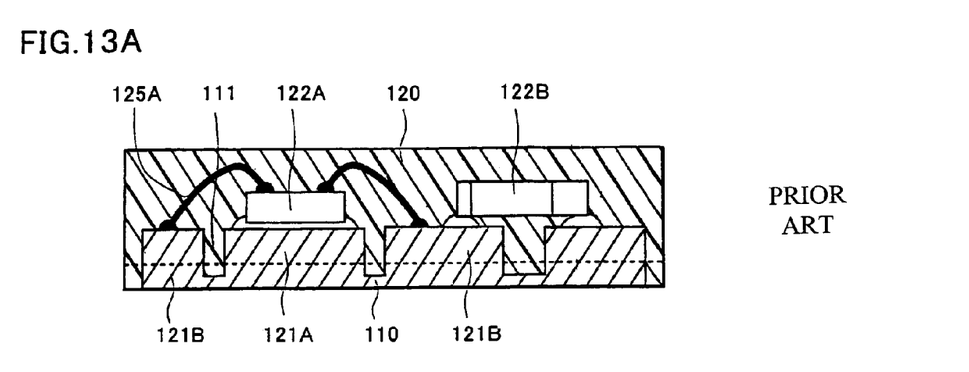
FIGS. 13(A) through 13(C) are views showing a conventional method for manufacturing circuit devices.
Figure 13B:
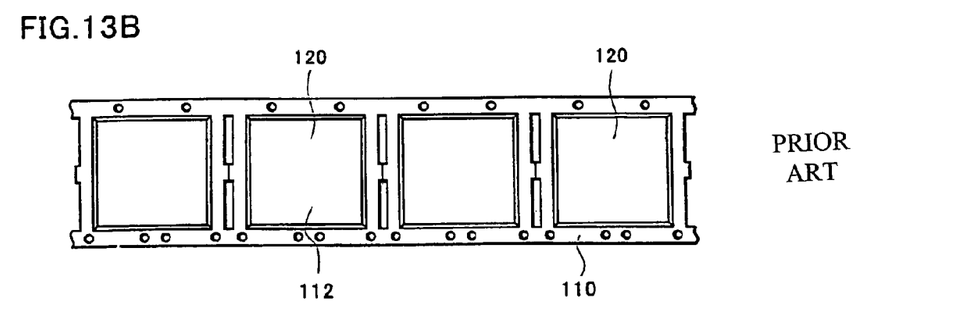
Figure 13C:
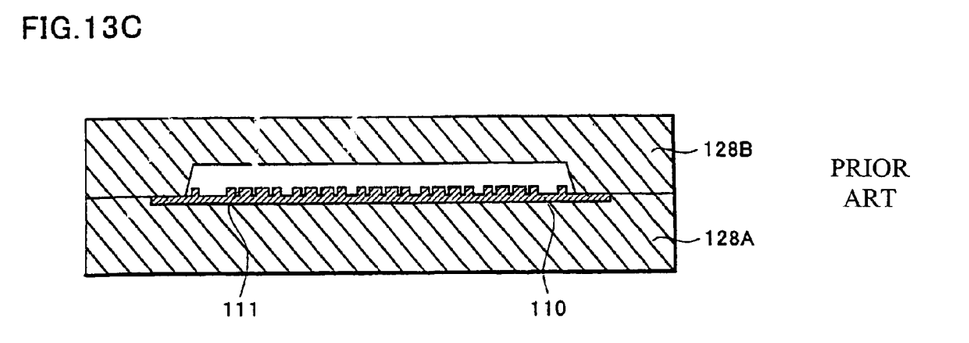

Referring to FIGS. 13(A)–13(C), a description will be given of a conventional method for manufacturing circuit devices. FIG. 13(A) is a sectional view of the step of performing transfer molding, FIG. 13(B) is a plan view of a conductive foil 110, and FIG. 13(C) is a sectional view seen when molding is performed.

Referring to FIGS. 13(A) and 13(B), a brief description will be given of steps prior to performing a molding operation. First, a conductive pattern 121A, 121B and/or 121C is formed by forming a separation groove 111 in a conductive foil 110. The conductive pattern 121 forms a block 112 by arranging mounting portions, each of which forms a circuit device, in a matrix form. A semiconductor element 122A and a chip resistor 122B are then fixed to a conductive pattern 121A of each mounting portion. Further, the semiconductor element 122A is electrically connected through a fine metal wire 125A to a conductive pattern 121B. Each block 112 is then sealed with an insulating resin 120 by use of a cavity. Through these steps, a circuit element 122 of each block 112 is sealed, and the separation groove 111 is also filled with the insulating resin 120.

Referring to FIG. 13(C), a description will be given of a sealing step that uses a mold 128A, 128B. The mold 128A, 128B used to perform resin sealing for each block 112 consists of a lower mold 128A and an upper mold 128B. The face of the lower mold 128A to be brought into contact with the conductive foil 110 is flattened. The upper mold 128B has such a shape as to form a cavity above the conductive foil 110 to which the circuit element 122 has been fixed. The mold 128A, 128B has a gate at its side, and resin sealing is performed by filling an insulating resin 120 through this gate.

After performing the molding operation in the aforementioned steps, the backface of the conductive foil 110 is entirely removed up to the part shown by the dotted line of FIG. 13(A), whereby each conductive pattern 121A, 121B and/or 121C is electrically separated. Lastly, a solder resist and an external electrode are formed for backface treatment and are separated into the respective devices by dicing, thus completing a circuit device.

However, in the molding step, there is a situation in which air intervenes between the backface of the conductive foil 110 and the lower mold 128A. Therefore, disadvantageously, air will gather on the opposite side of the gate, and the conductive foil 110 will locally rise in the cavity because of air pressure if the insulating resin 120 is filled through the gate provided at the side face of the mold 128 in this situation. If the conductive foil 110 locally rises within the cavity, the circuit element 122A, 122B and the fine metal wire 125A fixed to the conductive foil 110 in this area will come into contact with the upper mold 128B. Disadvantageously, this causes bending of the fine metal wire 125A or the like.

SUMMARY OF THE INVENTION

The present invention has been made in consideration of these problems. It is therefore a primary object of the present invention to provide a method for manufacturing circuit devices that can prevent the conductive foil from locally rising in the molding step.

The preferred embodiments include the step of forming conductive patterns, each of which forms a mounting portion including a mounting area of a circuit element, on a planar body, the step of disposing the circuit element on the conductive pattern, the step of performing resin sealing while releasing air between a backface of the planar body and a lower mold outward by bringing the lower mold having an air vent into contact with the backface of the planar body and by sealing a surface of the planar body with an insulating resin so that the circuit element is covered therewith, and the step of separating the insulating resin for each mounting portion.

Therefore, in the molding step, the planar body can be prevented from being locally bent so as not to allow the circuit element disposed on the surface of the planar body to come into contact with the upper face of the cavity and break. Herein, the planar body includes well-known substrates, such as a conductive foil, an insulating sheet in which a plurality of conductive foils are piled up through an insulating layer, a glass epoxy substrate, a metal substrate, and a ceramic substrate.

According to a method for manufacturing circuit devices of the preferred embodiments, in the resin sealing step, air intervening between the backface of the conductive foil 10 and the lower mold 28A can be released outward by providing the air vent 30 at the location corresponding to each block of the lower mold 28A to perform resin sealing. Therefore, the conductive foil 10 can be prevented from locally rising because of air gathered by the charged pressure of the insulating resin 20, and the circuit element 22 can be prevented from coming into contact with the upper mold. Accordingly, the metal wire 25A can be prevented, for example, from being bent.

Additionally, since the conductive foil 10 can be prevented from rising as mentioned above, the thickness of the cavity 29 can be reduced. Therefore, a thinner circuit device can be manufactured.

BRIEF DESCRIPTION OF THE DRAWINGS

FIG. 1(A) is a sectional view.

FIG. 3(A) is a sectional view.

FIG. 5(A) is a plan view.

FIG. 6(A) is a sectional view.

FIG. 7(A) is a sectional view.

FIG. 10(A) is a sectional view, FIG. 10(B) is a sectional view.

FIG. 11(A) is a sectional view.

FIG. 12(A) is a sectional view, FIG. 12(B) is a sectional view.

DETAILED DESCRIPTION OF THE PREFERRED EMBODIMENTS (First Embodiment)

The method for manufacturing circuit devices of this preferred embodiment includes the step of forming conductive patterns 21, which form a plurality of mounting portions 15 of a circuit element 22 on a conductive foil 10, in each block 12, the step of disposing the circuit element 22 on each mounting portion 15 of the conductive pattern 21 in each block 12, the step of performing resin sealing while releasing air between a backface of the conductive foil 10 and a lower mold 28A outward by bringing the lower mold 28A having an air vent 30 into contact with the backface of the conductive foil 10 in each block 12 and by performing transfer molding with an insulating resin 20 while disposing each mounting portion 15 of the block 12 in the same cavity, and the step of separating the insulating resin 20 for each mounting portion 15 by dicing. These steps will be described hereinafter.

As shown in FIG. 1 and FIGS. 3(A)–3(C), the first step of this preferred embodiment is to form conductive patterns 21 that form a plurality of mounting portions 15 of a circuit element 22 on a conductive foil 10 in each block 12. Concretely, for example, a conductive foil 10 is prepared, and a separation groove 11 whose depth is shallower than the thickness of the conductive foil 10 is formed in the conductive foil 10 in at least an area excluding conductive patterns 21 that form a plurality of mounting portions of a circuit element 22, thus forming the conductive pattern 21 in each block 12.

Figure 1A:
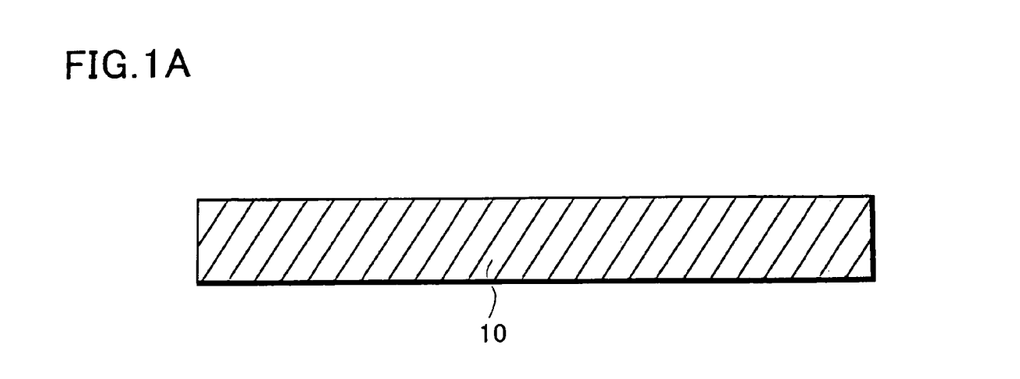

In this step, a sheet-like conductive foil 10 is first prepared as shown in FIG. 1(A). The adhesiveness of a brazing material, the bonding strength thereof, and the plating properties thereof are considered to determine the material of the conductive foil 10. A conductive foil consisting chiefly of Cu, a conductive foil consisting chiefly of Al, or a conductive foil of a Fe—Ni alloy is employed as the material.

Figure 1B:
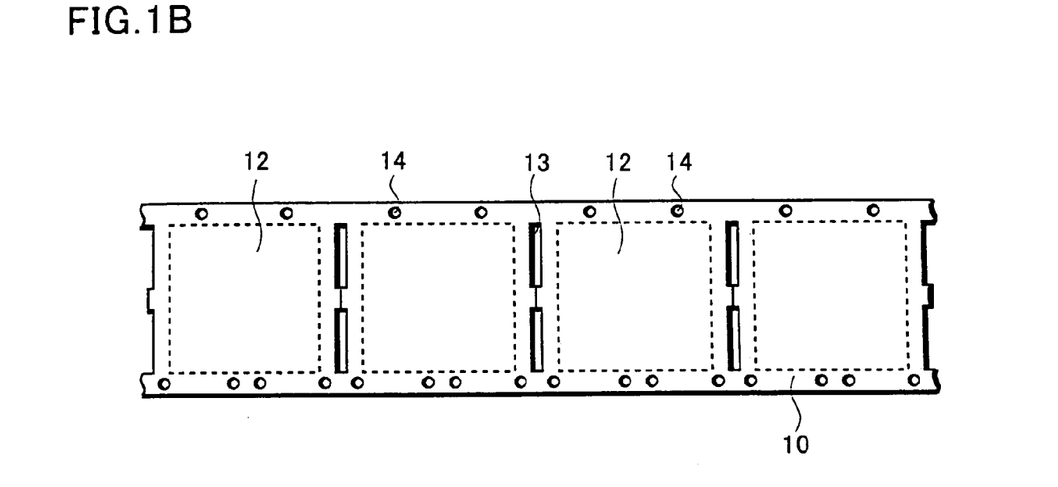
FIG. 1(B) is a plan view describing a method for manufacturing circuit devices of the preferred embodiments.

Concretely, as shown in FIG. 1(B), four or five blocks 12 where a plurality of mounting portions are formed are evenly spaced on the strip-like conductive foil 10. Slits 13 provided between the blocks 12 are used to absorb the stress of the conductive foil 10 generated by heat treatment in a molding step or other steps. Index holes 14, which are used for positioning in each step, are formed at regular intervals at the upper and lower peripheral edges of the conductive foil 10. Subsequently, a conductive pattern 21 for each block is formed.

Figure 2:
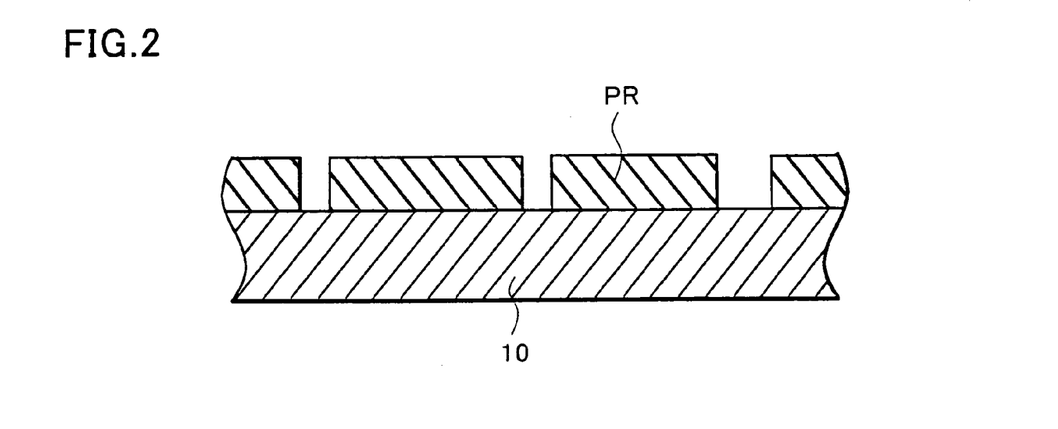
FIG. 2 is a sectional view showing a method for manufacturing circuit devices of the preferred embodiments.
Figure 3A:
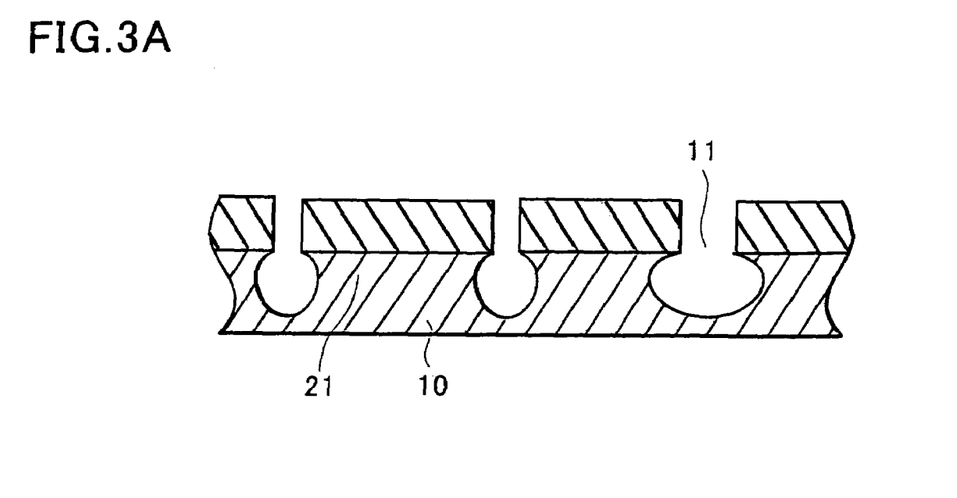

First, a photoresist (etching mask) PR is formed on the conductive foil 10 as shown in FIG. 2 and is subjected to patterning so that the conductive foil 10 excluding an area occupied by the conductive pattern 21 is exposed. Subsequently, the conductive foil 10 is selectively etched through the photoresist PR as shown in FIG. 3(A). The depth of the separation groove 11 formed by the etching is, for example, 50 im. The side face of the groove becomes rough and hence increases in adhesiveness to the insulating resin 20.

The sidewall of the separation groove 11 can have different structures according to the removing method. The removing step can employ wet etching, dry etching, laser evaporation, and dicing. In the case of wet etching, ferric chloride or cupric chloride is chiefly employed as an etchant, and the conductive foil is dipped in the etchant or is showered with the etchant. Generally, etching is performed not-anisotropically in the wet etching, and therefore the side face thereof has a curved structure.

Figure 3B:
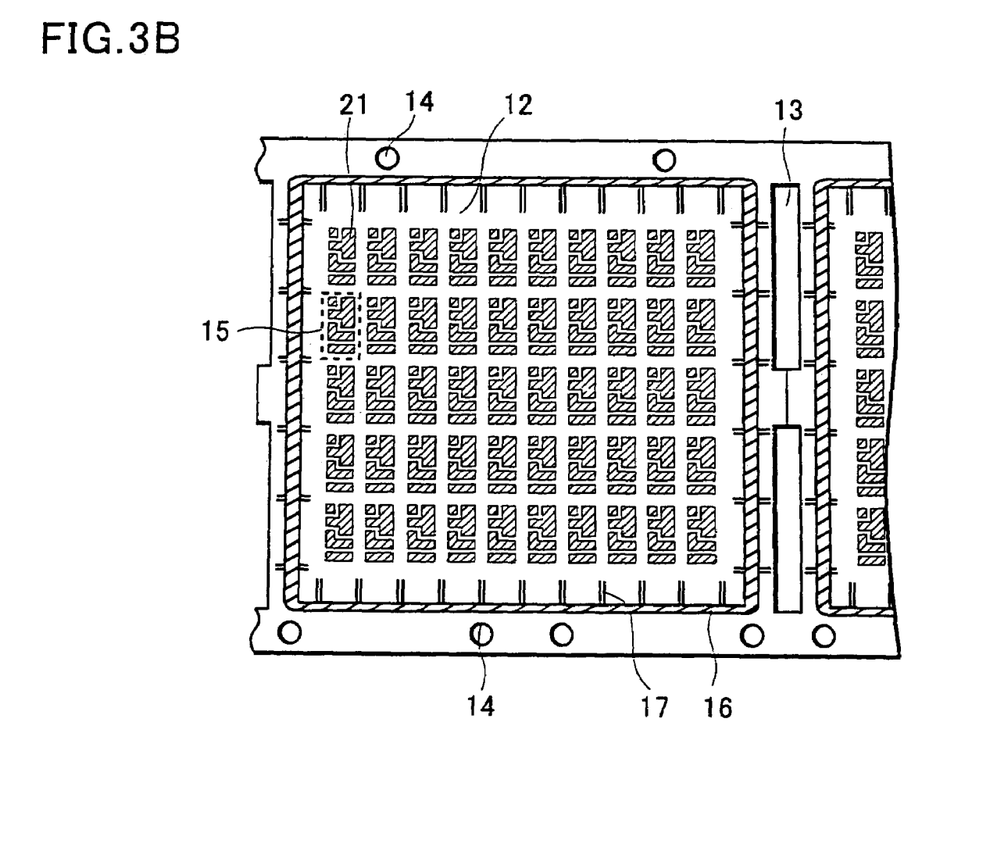
FIG. 3(B) is a plan view illustrating a method for manufacturing circuit devices of the preferred embodiments.

FIG. 3(B) shows a concrete example of the conductive pattern 21. This figure is an enlarged view of one of the blocks 12 shown in FIG. 1(B). One part surrounded by dashed line is one mounting portion 15 and forms the conductive pattern 21. A plurality of mounting portions 15 are arranged in a five-by-ten matrix form in one block 12. Each mounting portion 15 has the same conductive pattern 21. A frame-like pattern 16 is provided at the periphery of each block. An alignment mark 17 used in dicing is provided slightly apart from the pattern 16 and thereinside.

Figure 4:
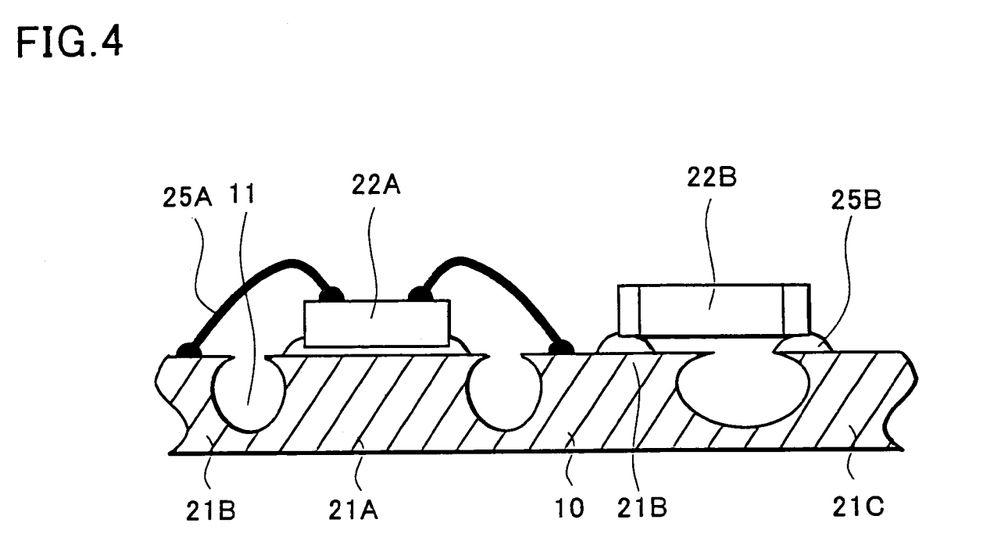
FIG. 4 is a sectional view showing a method for manufacturing circuit devices of the preferred embodiments.

The second step of this preferred embodiment is to dispose the circuit element 22 on each mounting portion 15 of the conductive pattern 21 in each block 12 as shown in FIG. 4. Semiconductor elements, such as a transistor, diode, and IC chip, or passive elements, such as a chip capacitor and chip resistor, can be mentioned as the circuit element 22. In addition, face-down type semiconductor elements, such as CSP and BGA, can be mounted although they have a relatively large thickness.

In this embodiment, a bare transistor chip 22A is fixed to the conductive pattern 21A by die bonding. A connection between an emitter electrode and the conductive pattern 21B and a connection between a base electrode and the conductive pattern 21B are made through a fine metal wire 25A fixed by ball bonding by thermocompression or wedge bonding by ultrasonic waves. Reference character 22B designates a chip capacitor or a passive element, which is fixed with a brazing material, such as solders, or with a conductive paste 25B. Since a plurality of conductive patterns 21 are gathered in each block 12, this step has the advantage that the fixing of the circuit element 22 and the wire bonding thereto can be efficiently performed.

Figure 5A:
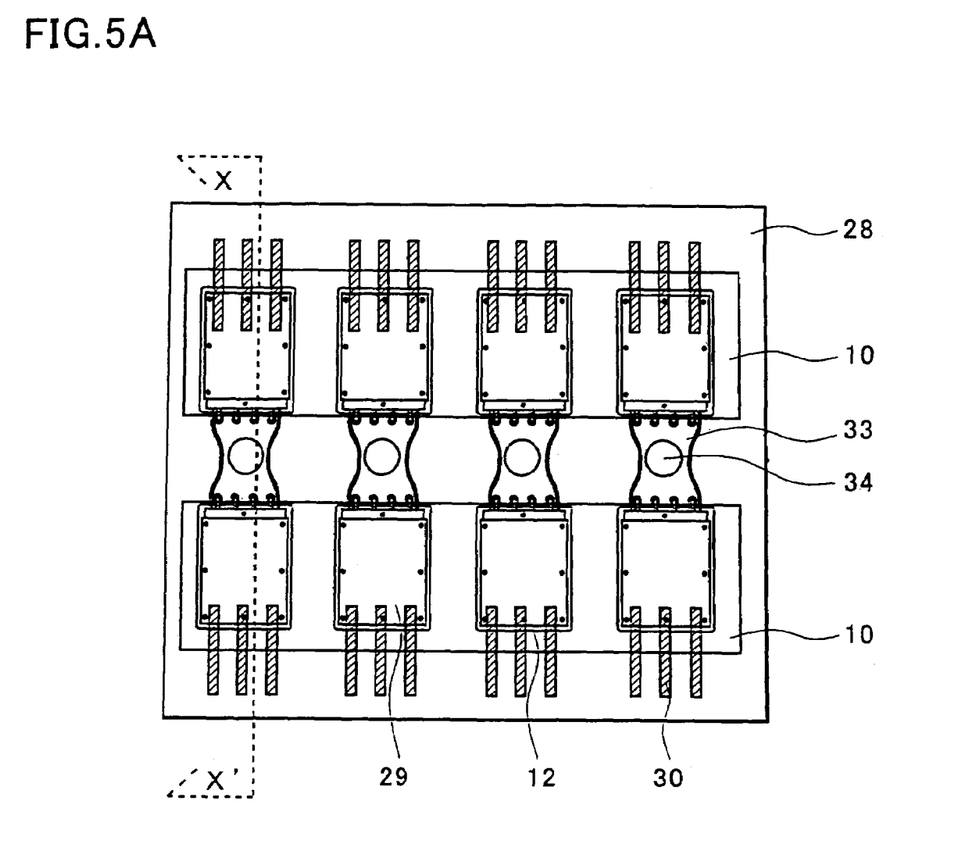
Figure 5B:
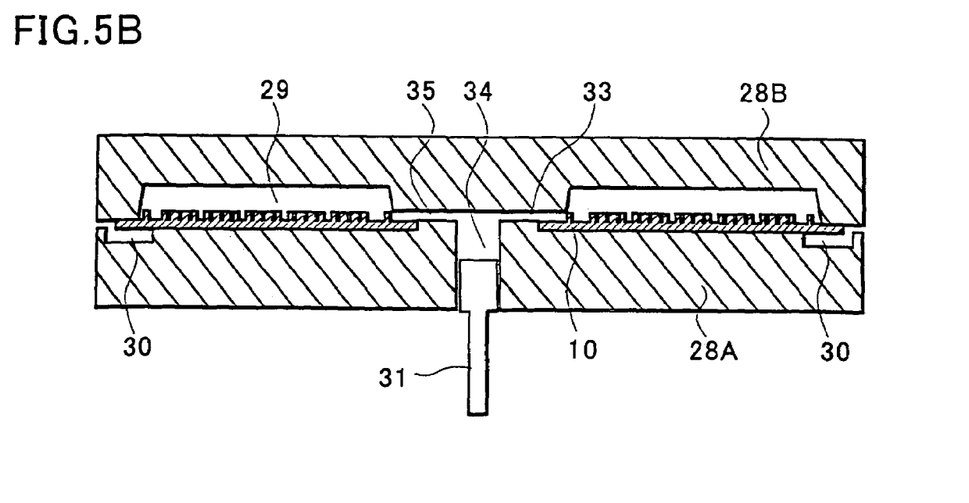
FIG. 5(B) is a sectional view depicting a method for manufacturing circuit devices of the preferred embodiments.
Figure 6A:
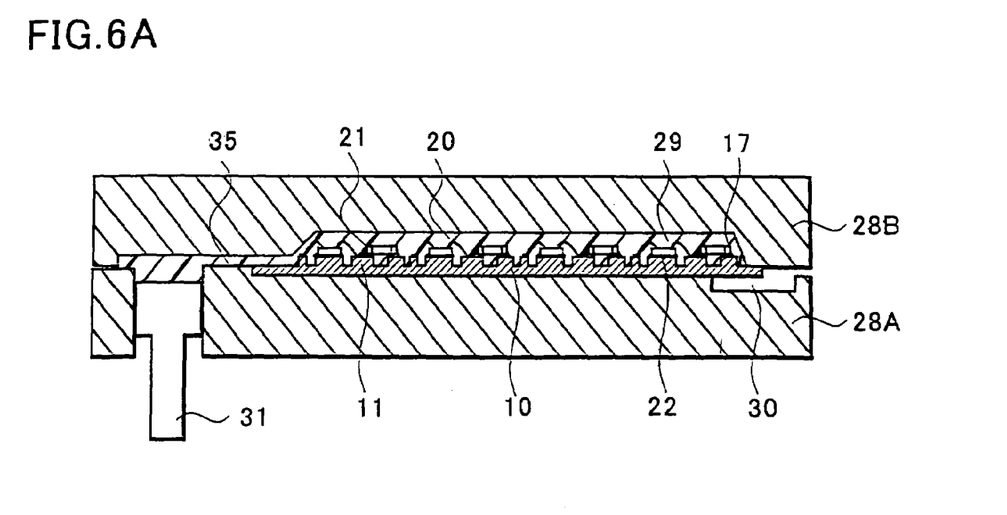
Figure 6B:
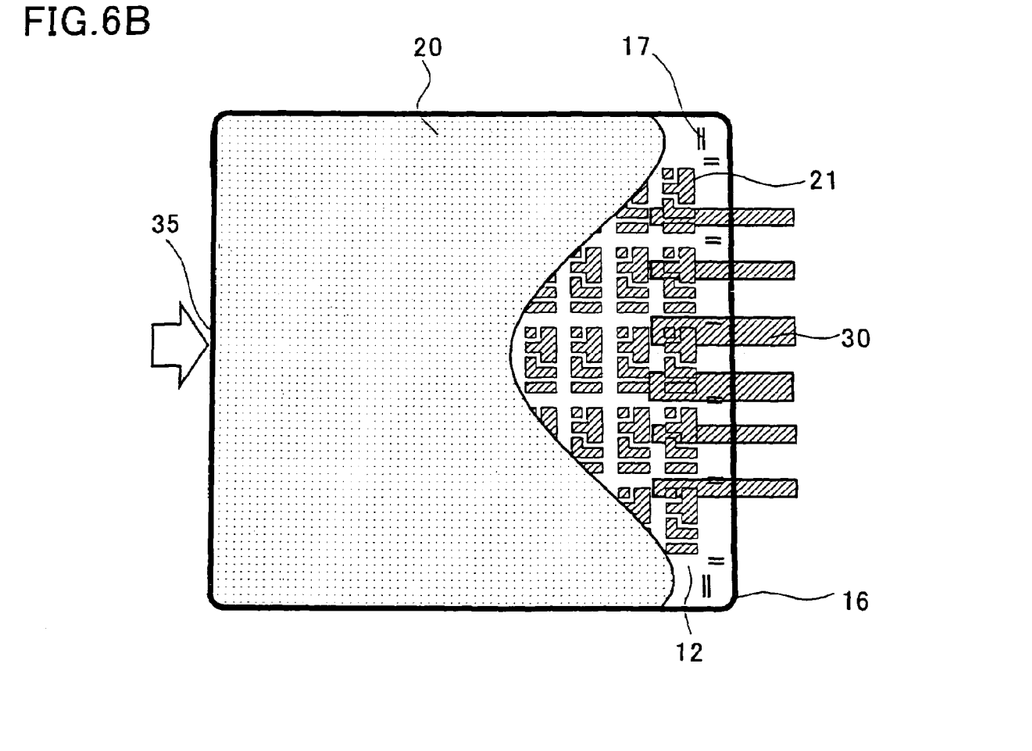
FIG. 6(B) is a plan view describing a method for manufacturing circuit devices of the preferred embodiments.
Figure 7A:
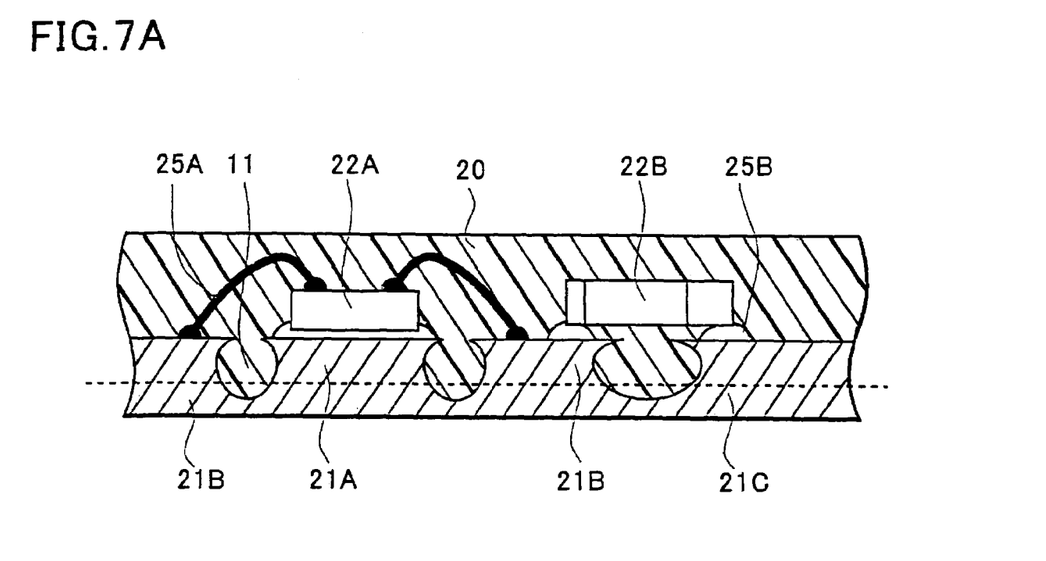
Figure 7B:
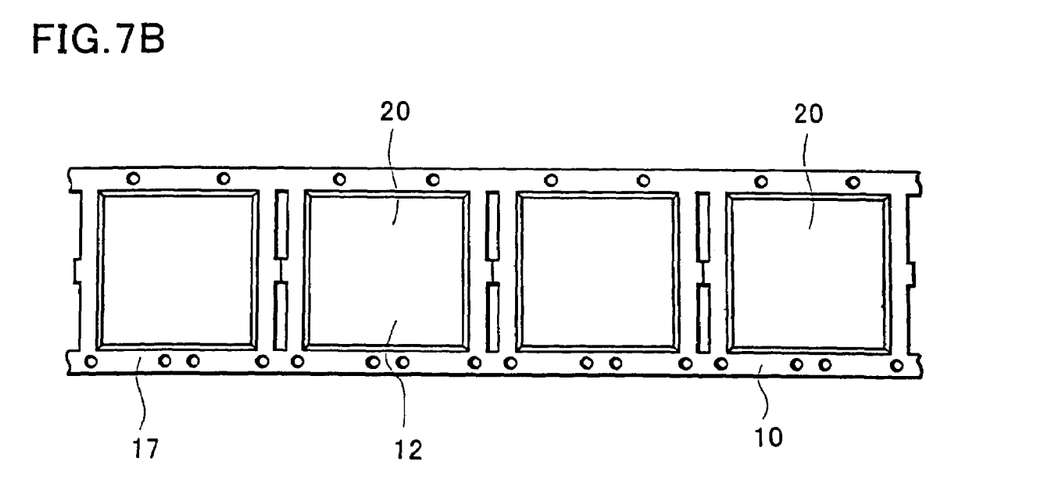
FIG. 7(B) is a plan view illustrating a method for manufacturing circuit devices of the preferred embodiments.

As shown in FIG. 5 to FIG. 7, the third step of the preferred embodiment is to bring a lower mold 28A having an air vent 30 into contact with the backface of the conductive foil 10 in each block 12 and to subject the mounting portions 15 in each block 12 to transfer molding with the insulating resin 20 while disposing them in the same cavity and thereby to perform resin sealing while releasing air between the backface of the conductive foil 10 and the lower mold 28A outward.

First, a description will be given of the shape and so on of the mold 28 used for transfer molding in this step with reference to FIG. 5. FIG. 5(A) is a plan view of the mold 28, and FIG. 5(B) is a sectional view along line X–X' of FIG. 5(A).

The mold 28 consists of the upper mold 28B and the lower mold 28A. In this embodiment, the lower mold 28A has flat areas where two conductive foils 10 are placed and has a plurality of air vents 30 for each block 12 formed in each conductive foil 10. The upper mold 28B presses the surface of the remaining part of the conductive foil 10 around each block 12 and has cavities 29 formed at corresponding locations above each block 12 of the conductive foil 10.

A plurality of air vents 30 are formed at a side that faces the gate 35 of the cavity 29 provided for each block. The air vent 30 has a depth such that air between the backface of the conductive foil 10 and the lower mold 28A can pass therethrough, and is planarly extended from the interior of each cavity to the outer part of the conductive foil 10. The air vent 30 is further extended in a manner so as to planarly stride over an edge of the cavity 29 and an edge of the conductive foil 10. Although the plurality of air vents 30 are provided for each block, the cross-sectional size of the air vent 30 provided at the central part of the block tends to be larger than that of the air vent 30 provided at the peripheral part thereof. Air intervening on the backface of the conductive foil 10 tends to concentrate in the vicinity of the central part of the block 12. Therefore, in this manner, the air intervening on the backface of the conductive foil 10 can be more positively released from the mold 28 outward by forming the air vent 30 provided at the central part to be larger than the air vent 30 provided at the peripheral part.

Referring to FIG. 5(A), the cavity 29 is formed for each block 12 in two conductive foils 10 disposed in parallel. A plurality of pots 34 supplying an insulating resin are formed in an area between the conductive foils 10. In this embodiment, the pots 34 are formed in the lower mold and are identical in number with the blocks 12 formed in each conductive foil 10. Runners 33 are formed so that the insulating resin 20 can be supplied from one pot 34 to two cavities 29 in close vicinity thereto.

A description will be given of the details of the molding step using the mold 28 with reference to FIG. 6. FIG. 6(A) is a sectional view of each block 12 during molding, and FIG. 6(B) is a plan view showing a state in which an insulating resin 20 is filled in the cavity 29.

Referring to FIG. 6(A), the conductive foil 10 is placed on the lower mold 28A, and the upper mold 28B is engaged with the lower mold 28A, thereby forming a cavity 29 above each block 12. In performing molding, a tablet of a hardened insulating resin 20 is supplied to the pot 34 and is pressed upward by a plunger 31 while heating the pot 34, thus supplying the insulating resin 120 to each cavity 29. A plurality of plungers 31 provided on the mold 28 are simultaneously actuated, and all the blocks 12 of the two conductive foils 10 are simultaneously sealed.

Referring to FIG. 6(B), a description will be given of a state in which the insulating resin 20 is filled into the cavity 29. The peripheral part of the block 12 has alignment marks 17 and hence circuit elements are not provided here. Therefore, the peripheral part of the block 12, which does not have the circuit element 22A and the fine metal wire 25A, has smaller resistance against the filling with the insulating resin 20 than the central part of the block 12 where the circuit element 22A and the fine metal wire 25A are formed. For this reason, when the insulating resin 20 is filled from the gate 35 into the cavity 29, the peripheral part of the block 12 is first filled with the insulating resin 20 prior to the central part thereof. Therefore, as shown in FIG. 6(B), the central part and its vicinity of the side facing the gate 35 is lastly sealed with the insulating resin. Accordingly, air existing between the conductive foil 10 and the lower mold 28A also gathers in the vicinity of the central part of the side facing the gate 35.

Since the air vents 30 are provided at the peripheral part of the block 12 opposite to the gate 35 of the lower mold 28A in this preferred embodiment, concentrating air can be released through the air vents 30 outward even when air between the conductive foil 10 and the lower mold 28A gathers there. A plurality of air vents 30 are formed and the air vents 30 provided at the central part have large cross sections. Therefore, concentrating air is released through the air vents 30 outward even when air gathers at the central part of the side opposite to the gate 35. Accordingly, in the resin sealing step, the conductive foil 10 can be prevented from locally rising because of the concentration of air. Therefore, the circuit element 22 can be prevented from being destroyed as a result.

Next, a description will be given of a state after the completion of the resin sealing with reference to FIG. 7. The circuit elements 22A and 22B, the conductive patterns 21A, 21B, and 21C are covered with the insulating resin 20, and the separation groove 11 between the conductive patterns 21 is filled with the insulating resin 20. The insulating resin 20 engages with the curved structure of the side faces of the conductive patterns 21A, 21B, and 21C so as to form a firm connection therebetween. The conductive patterns 21 are supported by the insulating resin 20. In this step, a thermosetting resin, such as epoxy resin, may be used for transfer molding.

This step has an advantage that the conductive foil 10 to be formed into the conductive patterns 21 serves as a supporting substrate until it is covered with the insulating resin 20. Therefore, the manufacturing procedure can be performed with fewer materials and costs can be reduced.

Subsequently, the conductive patterns 21 are electrically separated by removing a thick part of the conductive foil 10 having no separation groove 11. Concretely, they are separated by removing an area having the conductive patterns 21 of the block 12 of a thick part of at least the conductive foil 10 having no separation groove 11. In this step, the conductive foil 10 is selectively wet-etchedat an area having the conductive patterns 21 up to the position shown by the dotted line in FIG. 7(A) where the insulating resin 20 is exposed. As a result, the conductive pattern 21 is separated as a conductive pattern having a thickness of approximately 40 im, and the backface of the conductive pattern 21 is structured to be exposed in the insulating resin 20.

Figure 8:
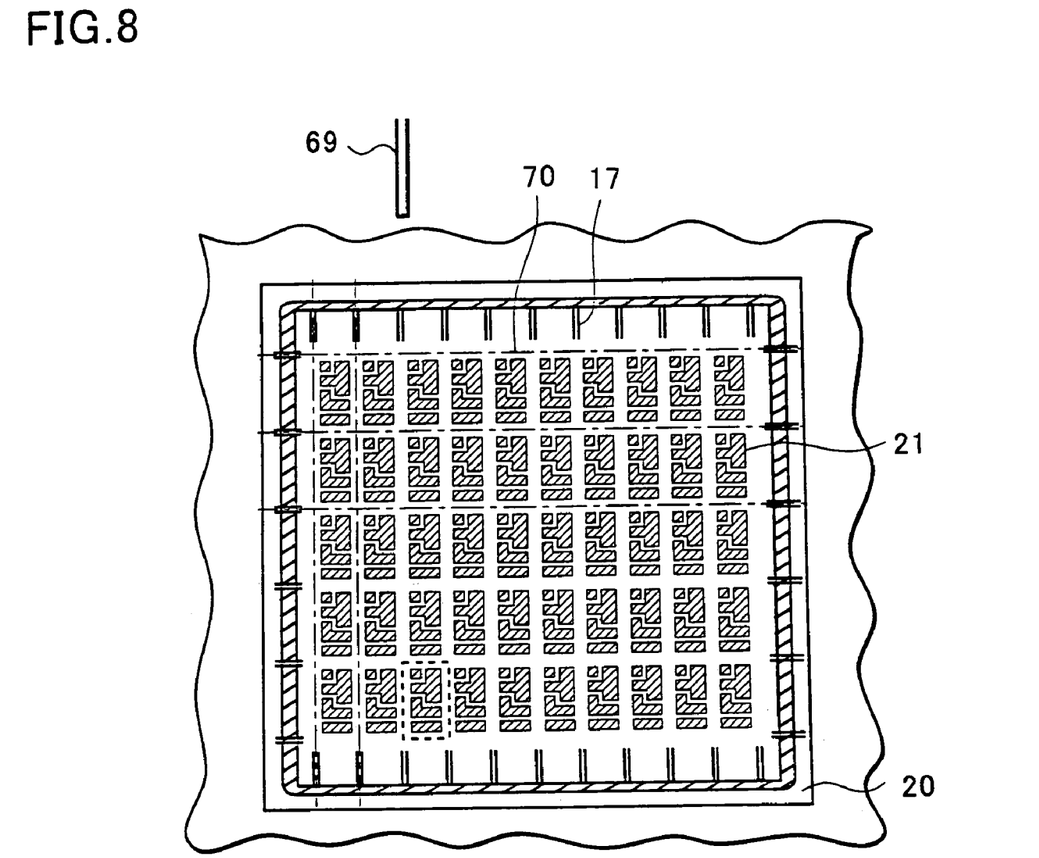
FIG. 8 is a plan view showing a method for manufacturing circuit devices of the preferred embodiments.

The fourth step of this preferred embodiment is to separate the insulating resin 20 of the block 12 by dicing each mounting portion 15 as shown in FIG. 8.

In this step, a plurality of blocks 12 adhered to a pressure sensitive adhesive sheet are adsorbed in a vacuum onto a mounting plate of a dicing device, and the insulating resin 20 of the separation groove 11 is diced with a dicing blade 69 along a dicing line 70 between the mounting portions 15 so as to be separated into each individual circuit device 53.

Figure 9:
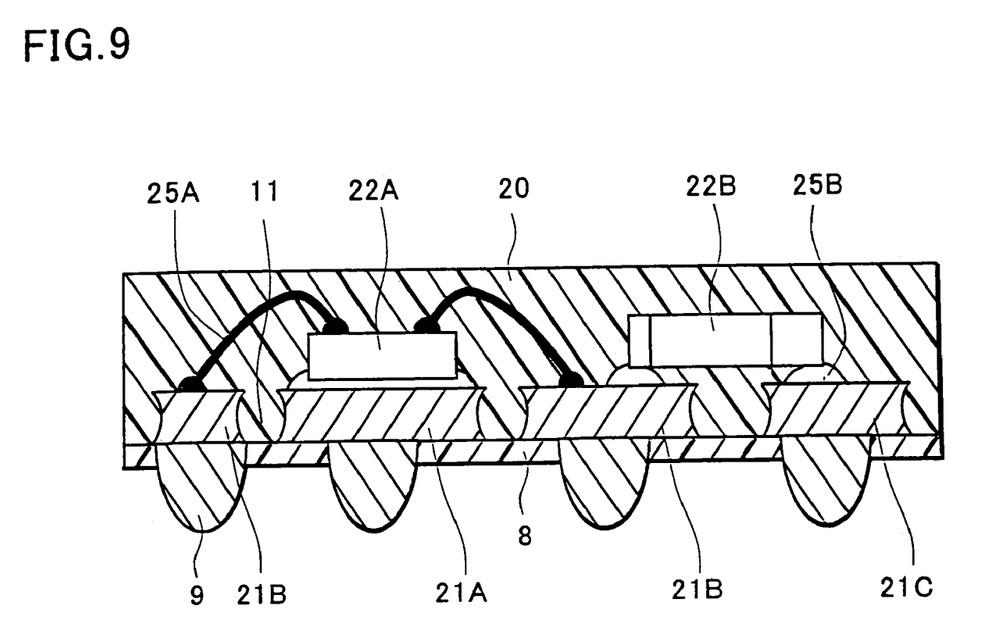
FIG. 9 is a sectional view illustrating a method for manufacturing circuit devices of the preferred embodiments.

Referring to FIG. 9, a description will be given of the structure of a circuit device manufactured through the aforementioned steps. The circuit device shown in FIG. 9 is made up of a conductive pattern 21, a circuit element 22 fixed onto the conductive pattern 21, a fine metal wire 25 that electrically connects a semiconductor chip 22A to a conductive pattern 21B, and an insulating resin 20 that supports and seals the entire device while exposing the backface of the conductive pattern 21. The conductive pattern 21 appearing from the backface of the insulating resin 20 is covered with a resist 8. An external electrode 9 made of a brazing material, such as solder, is formed at a desired place.

(Second Embodiment)

In the first embodiment mentioned above, a description has been given of the method for manufacturing the circuit device having a single-layer wiring structure. In a second embodiment, a description will be given of a method for manufacturing circuit devices having a multi-layer wiring structure.

Figure 10A:
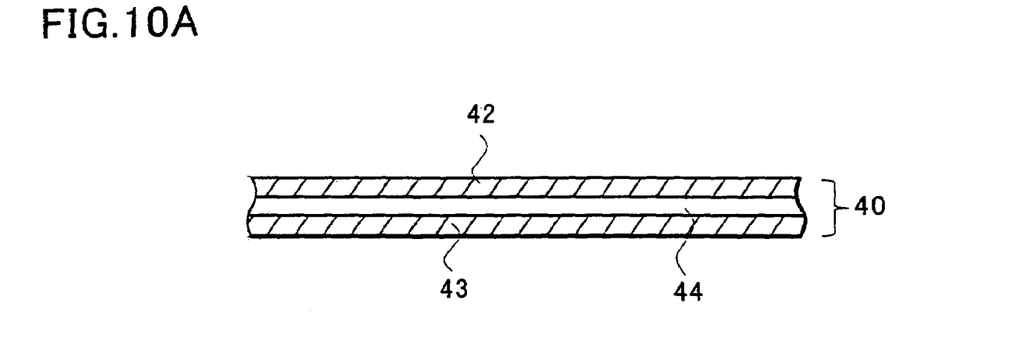

Referring to FIG. 10(A), an insulating sheet 40 in which a first conductive foil 42 and a second conductive foil 43 are laminated through an insulating layer 44 is prepared. According to mechanical strength or the like that is required for the insulating sheet 40, the thickness of the first conductive foil 42 and that of the second conductive foil 43 can be changed within the range of approximately several tens to several hundreds of microns (im). Therefore, the thickness of the insulating sheet 40 also can be changed within the range of approximately several tens to several hundreds of microns (im). The first conductive foil 42 may be formed to have a thickness of approximately 50 im in order to form a desired fine pattern. The second conductive foil 43 may be thickly formed to have a thickness of approximately 200 im in consideration of mechanical strength.

Figure 10B:
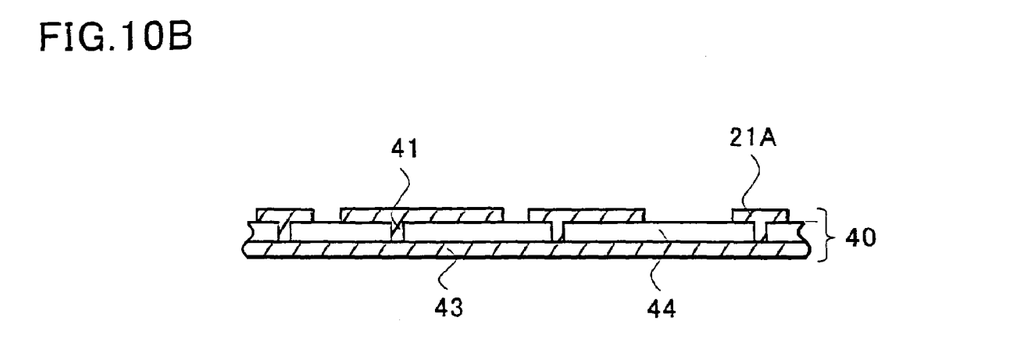

Referring to FIG. 10(B), subsequently, the first conductive foil 42 is selectively removed to form a first conductive pattern 21A electrically connected to a second conductive film 43 through a connecting portion 41. Concretely, the first conductive foil 42 and the insulating layer 44 in an area where the connecting portion 41 is to be formed are first removed. The first conductive foil 42 is partially removed by etching, and the insulating layer 44 is partially removed by a laser. By forming a plated film, after the formation of the connecting portion 41, the first conductive pattern 21A is formed by performing a patterning process to the first conductive foil 42.

Figure 10C:
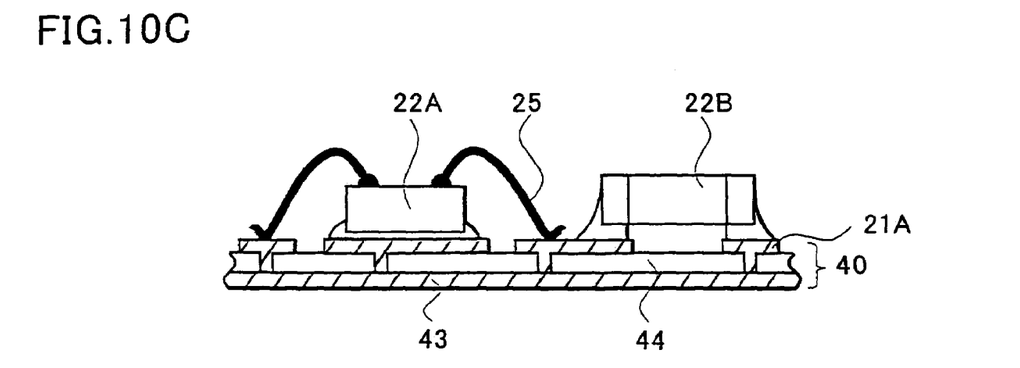
FIG. 10(C) is a sectional view showing a method for manufacturing circuit devices of the preferred embodiments.

Referring to FIG. 10(C), the circuit element 22 made up of the semiconductor element 22A and the chip element 22B is then fixed to the first conductive pattern 21A.

Figure 11A:
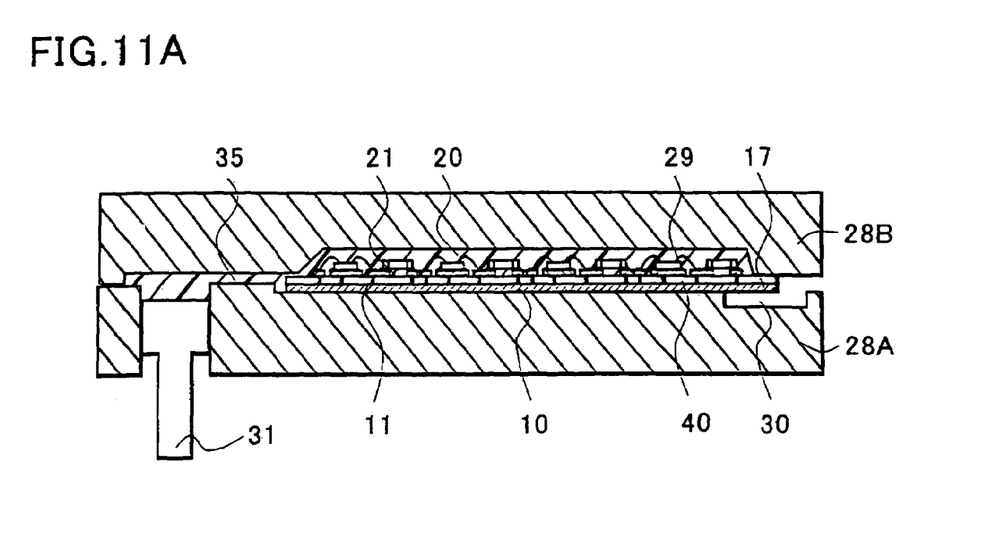
Figure 11B:
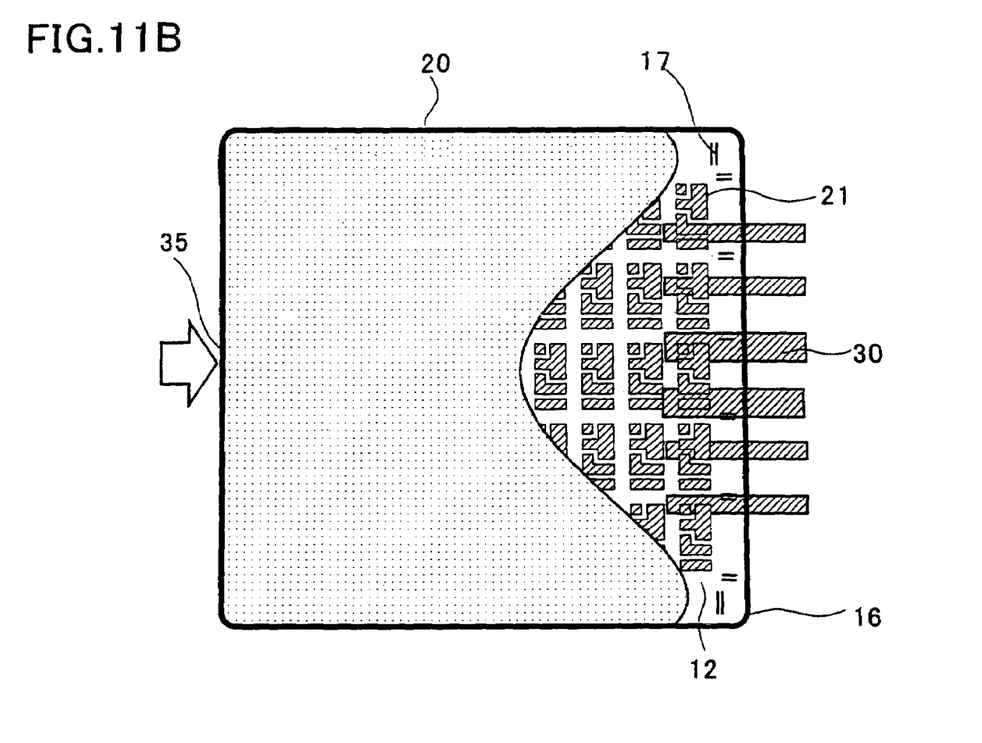
FIG. 11(B) is a plan view showing a method for manufacturing circuit devices of the preferred embodiments.
Figure 12A:
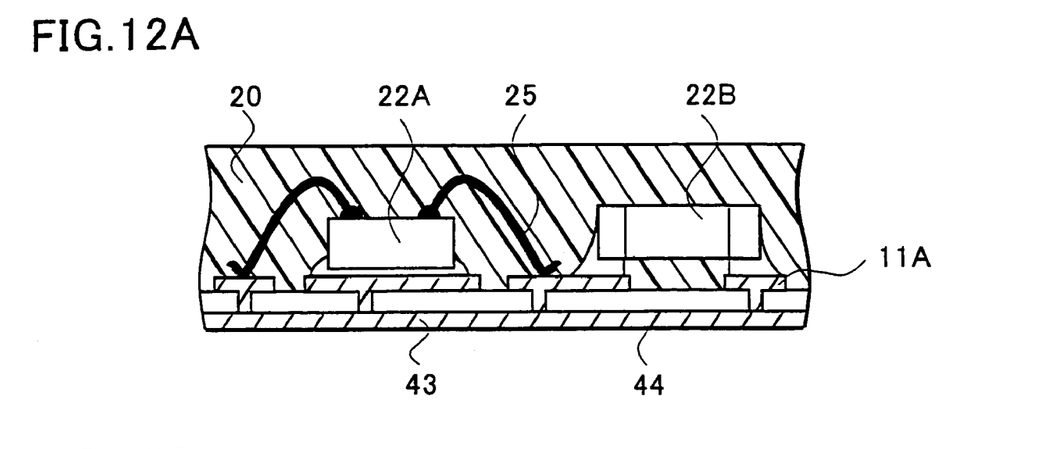

Referring to FIG. 11, the surface of the insulating sheet 40 is then sealed with the insulating resin 20 so as to cover the circuit element 22. Since the details of this step are the same as the step described in the first embodiment referring to FIG. 5 and FIG. 6, the details thereof are omitted. Although the conductive foil made of a single metal on which the circuit element 22 is mounted has been set in the interior of the cavity 29 in the first embodiment, the insulating sheet 40 on which the circuit element 22 is mounted is set in the interior of the cavity 29 in the second embodiment. Since the insulating sheet 40 is thinly formed as described above, the insulating sheet 40 is weak in rigidity, and there is the possibility that conventional problems will occur. Therefore, the function of the air vent 30 of this preferred embodiment can prevent the insulating sheet 40 from being deformed (i.e., rising) within the cavity 29. This effect can be exhibited also in the insulating sheet 40 having a multi-layer wiring structure of three or more layers. FIG. 12(A) is a sectional view of the insulating sheet 40 in which the insulating resin 20 is formed so that the semiconductor element 22A and the chip element 22B are covered therewith.

Figure 12B:
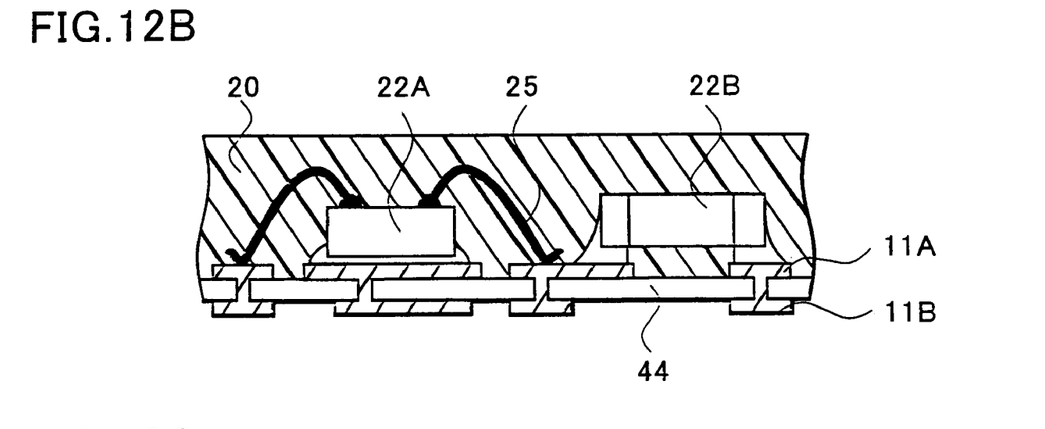
Figure 12C:
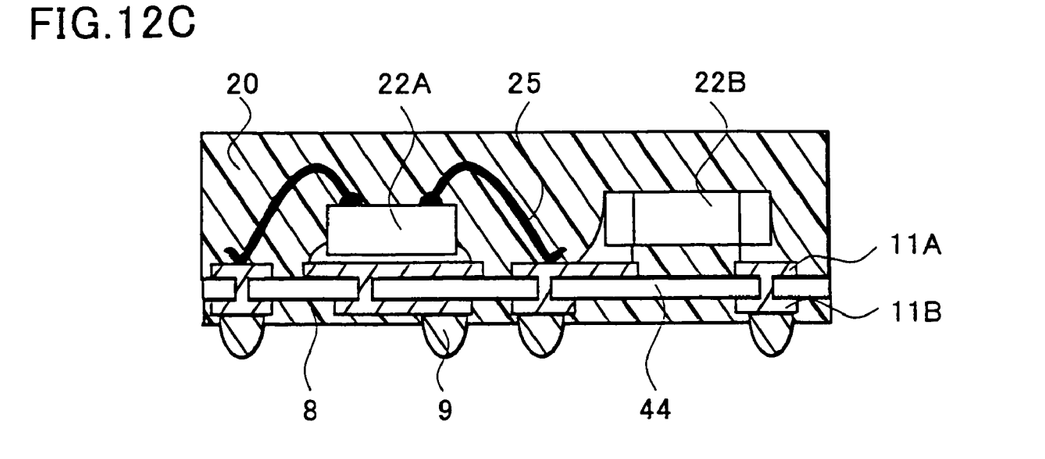
FIG. 12(C) is a sectional view illustrating a method for manufacturing circuit devices of the preferred embodiments.

Referring to FIG. 12(B), subsequently, the second conductive foil 43 of the backface is partially removed, and thereby the second conductive pattern 21B is formed. A circuit device shown in FIG. 12(C) is completed by forming the resist 8 and the external electrode 9 of the backface.

What is claimed is:

1. A method for manufacturing circuit devices, the method comprising:

forming conductive patterns on a planar body, wherein the planar body is a conductive foil and the conductive patterns are formed in a convex shape by separation grooves, the conductive patterns forming mounting portions for circuit elements;

disposing a circuit element on at least one of the mounting portions;

bringing a backface of the planar body into contact with a lower mold having air vents to define a resin injection cavity above the planar body and air release passages that extend beneath the planar body, wherein the air release passages are at least partially formed from the backface of the planar body and the air vents;

sealing a surface of the planar body with an insulating resin so that the circuit element is covered therewith; and separating each mounting portion.

2. A method for manufacturing circuit devices, the method comprising:

forming conductive patterns on a planar body, the conductive patterns forming mounting portions for circuit elements;

disposing a circuit element on at least one of the mounting portions;

bringing a backface of the planar body into contact with a lower mold having air vents disposed in parallel to define a resin injection cavity above the planar body and air release passages that extend beneath the planar body, wherein the air release passages are at least partially formed from the backface of the planar body and the air vents;

sealing a surface of the planar body with an insulating resin so that the circuit element is covered therewith; and separating each mounting portion.

3. The method for manufacturing circuit devices as set forth in claim 2 further comprising forming a block that includes a plurality of the mounting portions arranged in a matrix form, wherein performing resin sealing comprises covering a plurality of circuit elements, each circuit element being coupled to one of the mounting portions.

4. The method for manufacturing circuit devices as set forth in claim 2, wherein an air vent provided at a central part is formed to be larger than an air vent provided at a peripheral part.

5. The method for manufacturing circuit devices as set forth in claim 2, wherein the air vent strides over a peripheral part of the cavity and is extended from inside the cavity to an outer part of the cavity.

6. The method for manufacturing circuit devices as set forth in claim 2 wherein bringing the backface of the planar body into contact with the lower mold having air vents comprises bringing the backface of the planar body into contact with at least one of the air vents.

7. The method for manufacturing circuit devices as set forth in claim 6 wherein bringing the backface of the planar body into contact with at least one of the air vents comprises enabling the release of air through the air vent from between the planar body and the lower mold.

8. A method for manufacturing circuit devices, the method comprising:

forming conductive patterns on a planar body, the conductive patterns forming mounting portions for circuit elements;

disposing a circuit element on at least one of the mounting portions;

bringing a backface of the planar body into contact with a lower mold having air vents to define a resin injection cavity above the planar body and air release passages that extend beneath the planar body, wherein the air release passages are at least partially formed from the backface of the planar body and the air vents;

sealing a surface of the planar body with an insulating resin so that the circuit element is covered therewith; and separating each mounting portion, wherein a plurality of blocks are aligned, in each block the conductive patterns form a plurality of mounting portions arranged in a matrix form on the planar body.

9. The method for manufacturing circuit devices as set forth in claim 8, wherein the insulating resin is formed by simultaneously subjecting all of the blocks of the conductive foil to transfer molding.

10. A method for manufacturing circuit devices, the method comprising:

forming conductive patterns on a planar body, the conductive patterns forming mounting portions for circuit elements;

disposing a circuit element on at least one of the mounting portions;

bringing a backface of the planar body into contact with a lower mold having air vents to define a resin injection cavity above the planar body and air release passages that extend beneath the planar body, wherein the air release passages are at least partially formed from the backface of the planar body and the air vents, wherein bringing the backface of the planar body into contact with the lower mold having air vents comprises bringing the backface of the planar body into contact with at least one of the air vents and sealing at least one of the air vents with the backface of the planar body;

sealing a surface of the planar body with an insulating resin so that the circuit element is covered therewith; and separating each mounting portion.

* * * * *